(12) United States Patent
Sakamoto

(10) Patent No.: US 12,068,347 B2
(45) Date of Patent: Aug. 20, 2024

(54) SOLID-STATE IMAGING DEVICE AND ELECTRONIC DEVICE

(71) Applicant: SONY SEMICONDUCTOR SOLUTIONS CORPORATION, Kanagawa (JP)

(72) Inventor: Michiko Sakamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 9 days.

(21) Appl. No.: 17/996,850

(22) PCT Filed: Mar. 4, 2021

(86) PCT No.: PCT/JP2021/008486
§ 371 (c)(1),
(2) Date: Oct. 21, 2022

(87) PCT Pub. No.: WO2021/220610
PCT Pub. Date: Nov. 4, 2021

(65) Prior Publication Data
US 2023/0163149 A1    May 25, 2023

(30) Foreign Application Priority Data
Apr. 28, 2020  (JP) ................................ 2020-079022

(51) Int. Cl.
*H01L 27/146*    (2006.01)
(52) U.S. Cl.
CPC .. *H01L 27/14621* (2013.01); *H01L 27/14627* (2013.01); *H01L 27/1464* (2013.01)

(58) Field of Classification Search
CPC ... G02B 3/00; H01L 27/146; H01L 27/14621; H01L 27/14623; H01L 27/14625;
(Continued)

(56) References Cited

U.S. PATENT DOCUMENTS

| 2006/0158547 A1 | 7/2006 | Komatsu et al. | |
| 2010/0123811 A1* | 5/2010 | Abe | H01L 27/14629 257/E31.127 |

(Continued)

FOREIGN PATENT DOCUMENTS

| JP | 2006-295125 | 10/2006 |
| JP | 2011-258728 | 12/2011 |

(Continued)

OTHER PUBLICATIONS

International Search Report and Written Opinion prepared by the Japan Patent Office on May 24, 2021, for International Application No. PCT/JP2021/008486, 3 pgs.

*Primary Examiner* — Amy R Hsu
(74) *Attorney, Agent, or Firm* — Sheridan Ross PC

(57) ABSTRACT

Provided is a solid-state imaging device capable of enhancing pixel sensitivity and preventing color mixture. A solid-state imaging device includes: a plurality of microlenses that condenses incident light; a plurality of color filters that transmits light of a specific wavelength included in the condensed incident light; a plurality of photoelectric conversion parts on which light having a specific wavelength transmitted through the color filter is incident; and a plurality of waveguide wall parts arranged between the color filters and surrounding the color filter. Then, each of the plurality of waveguide wall parts is formed in a position subjected to pupil correction.

15 Claims, 17 Drawing Sheets

(58) Field of Classification Search
CPC ......... H01L 27/14627; H01L 27/14629; H01L 27/1464; H01L 27/14645; H01L 27/14685
See application file for complete search history.

(56) References Cited

U.S. PATENT DOCUMENTS

| | | | |
|---|---|---|---|
| 2010/0230583 A1* | 9/2010 | Nakata | H01L 27/14621 257/E31.127 |
| 2010/0245648 A1* | 9/2010 | Tayanaka | H04N 25/778 348/308 |
| 2010/0301438 A1* | 12/2010 | Ogino | H01L 27/14627 257/E31.127 |
| 2011/0298074 A1 | 12/2011 | Funao | |
| 2013/0258154 A1* | 10/2013 | Masuda | H01L 31/0232 348/308 |
| 2014/0063303 A1* | 3/2014 | Masuda | H01L 27/14685 438/69 |
| 2014/0152878 A1 | 6/2014 | Ozawa et al. | |
| 2015/0041942 A1* | 2/2015 | Ebiko | H01L 27/14629 438/73 |
| 2015/0054103 A1 | 2/2015 | Mackey | |
| 2016/0351605 A1 | 12/2016 | Yang | |
| 2016/0351610 A1 | 12/2016 | Chen et al. | |
| 2017/0025458 A1* | 1/2017 | Lin | H01L 27/14645 |
| 2017/0338265 A1 | 11/2017 | Yoshiba et al. | |
| 2019/0206917 A1 | 7/2019 | Nakajiki et al. | |
| 2019/0252439 A1 | 8/2019 | Ogawa et al. | |

FOREIGN PATENT DOCUMENTS

| | | |
|---|---|---|
| JP | 2016-225584 | 12/2016 |
| JP | 2017-028241 | 2/2017 |
| JP | 2019-140252 | 8/2019 |
| WO | WO 2012/073402 | 6/2012 |
| WO | WO 2013/021541 | 2/2013 |
| WO | WO 2016/114154 | 7/2016 |
| WO | WO 2018/043654 | 3/2018 |

* cited by examiner

CENTER SIDE OF PIXEL REGION

CENTER SIDE OF PIXEL REGION

SOLID-STATE IMAGING DEVICE AND ELECTRONIC DEVICE

CROSS REFERENCE TO RELATED APPLICATIONS

This application is a national stage application under 35 U.S.C. 371 and claims the benefit of PCT Application No. PCT/JP2021/008486, having an international filing date of 4 Mar. 2021, which designated the United States, which PCT application claimed the benefit of Japanese Patent Application No. 2020-079022, filed 28 Apr. 2020, the entire disclosures of each of which are incorporated herein by reference.

TECHNICAL FIELD

The present disclosure relates to a solid-state imaging device and an electronic device.

BACKGROUND ART

Conventionally, a solid-state imaging device having a pixel region in which a photoelectric conversion part, a transparent insulating layer, a color filter, and a microlens are laminated in this order has been proposed (see Patent Document 1, for example). In the solid-state imaging device described in Patent Document 1, a separation part containing a low refractive material is disposed between color filters, and a waveguide is formed with the color filter as the core and the separation part (waveguide wall part) as the cladding, so that diffusion of incident light in the color filter is prevented and sensitivity of each pixel is improved.

Furthermore, on the end side (high image height) of the pixel region, incident light is obliquely incident on the microlens.

CITATION LIST

Patent Document

Patent Document 1: International Patent Application Publication No. 2012/073402

SUMMARY OF THE INVENTION

Problems to be Solved by the Invention

However, in the solid-state imaging device described in Patent Document 1, in a case where incident light is obliquely incident on the microlens, for example, there is a possibility that the incident light hits the microlens side of the waveguide wall part, a part of the incident light is reflected (scattered) by the waveguide wall part, and the scattered light enters the adjacent pixel to cause color mixture.

An object of the present disclosure is to provide a solid-state imaging device and an electronic device capable of enhancing pixel sensitivity and preventing color mixture.

Solutions to Problems

A solid-state imaging device of the present disclosure includes (a) a plurality of microlenses that condenses incident light, (b) a plurality of color filters that transmits light of a specific wavelength included in the condensed incident light, (c) a plurality of photoelectric conversion parts on which light having a specific wavelength transmitted through the color filter is incident, and (d) a plurality of waveguide wall parts arranged between the color filters and surrounding the color filter, and (e) each of the plurality of waveguide wall parts is formed in a position subjected to pupil correction.

An electronic device of the present disclosure includes (a) a solid-state imaging device that includes a plurality of microlenses that condenses incident light, a plurality of color filters that transmits light of a specific wavelength included in the condensed incident light, a plurality of photoelectric conversion parts on which light having a specific wavelength transmitted through the color filter is incident, and a plurality of waveguide wall parts arranged between the color filters and surrounding the color filter, each of the plurality of waveguide wall parts formed in a position subjected to pupil correction, (b) an optical lens that forms an image of image light from a subject on an imaging surface of the solid-state imaging device, and (c) a signal processing circuit that performs signal processing on a signal output from the solid-state imaging device.

MODE FOR CARRYING OUT THE INVENTION

Hereinafter, an example of a solid-state imaging device 1 and an electronic device according to embodiments of the present disclosure will be described with reference to FIGS. 1 to 13. Embodiments of the present disclosure will be described in the following order. Note that the present disclosure is not limited to the following examples. Furthermore, the effect described in the present specification is merely an illustration and is not restrictive. Hence, other effects can be obtained.

1. First embodiment: solid-state imaging device
    1-1 Overall configuration of solid-state imaging device
    1-2 Configuration of main part
    1-3 Method of forming color filter layer
    1-4 Modification
2. Second embodiment: example of application to electronic device 1. First Embodiment: Solid-State Imaging Device

[1-1 Overall Configuration of Solid-State Imaging Device]

Figure 1:
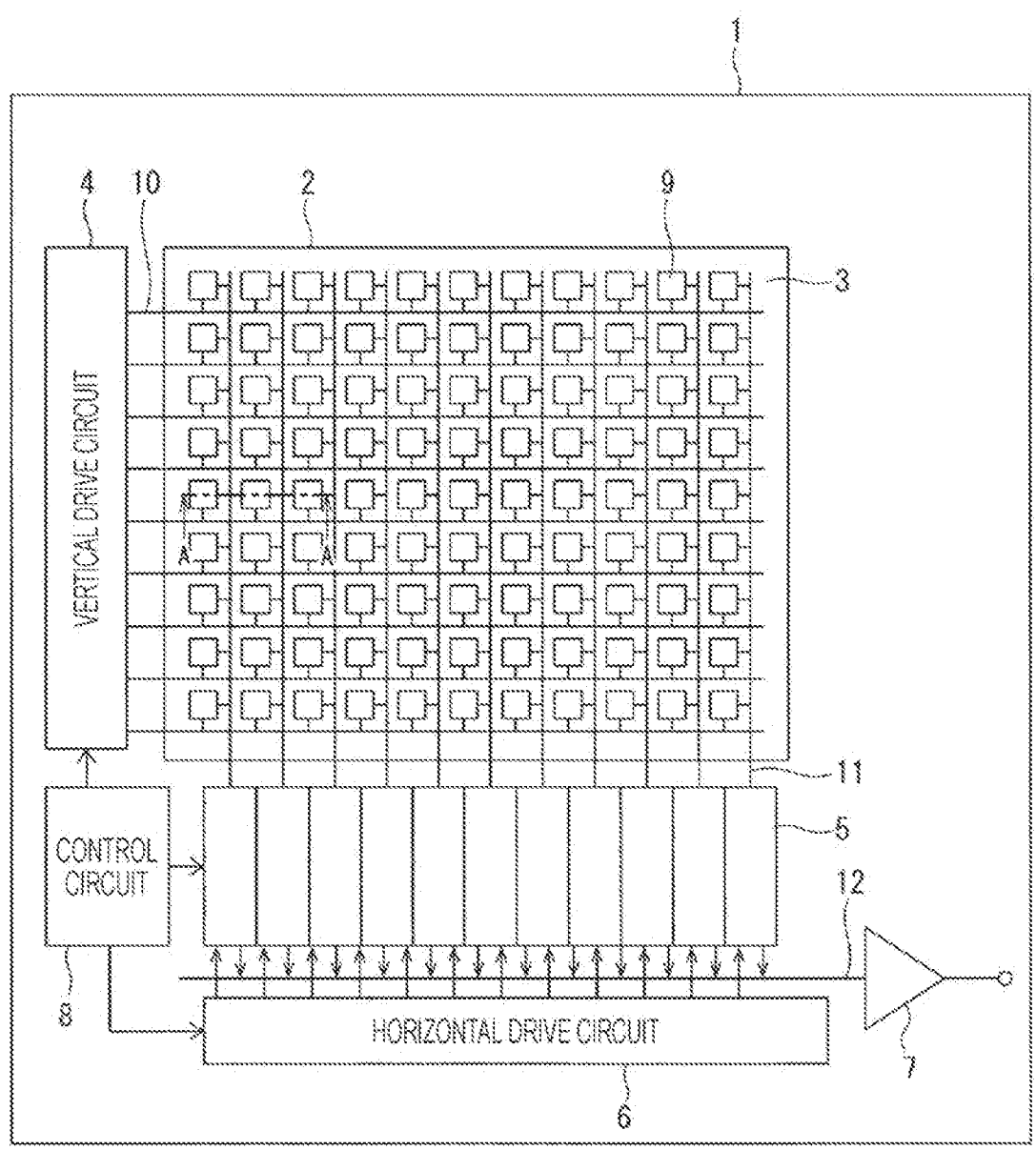
FIG. 1 is a diagram illustrating an overall configuration of a solid-state imaging device according to a first embodiment.

A solid-state imaging device 1 according to a first embodiment of the present disclosure will be described. FIG. 1 is a schematic configuration diagram illustrating the whole solid-state imaging device 1 according to the first embodiment of the present disclosure.

Figure 13:
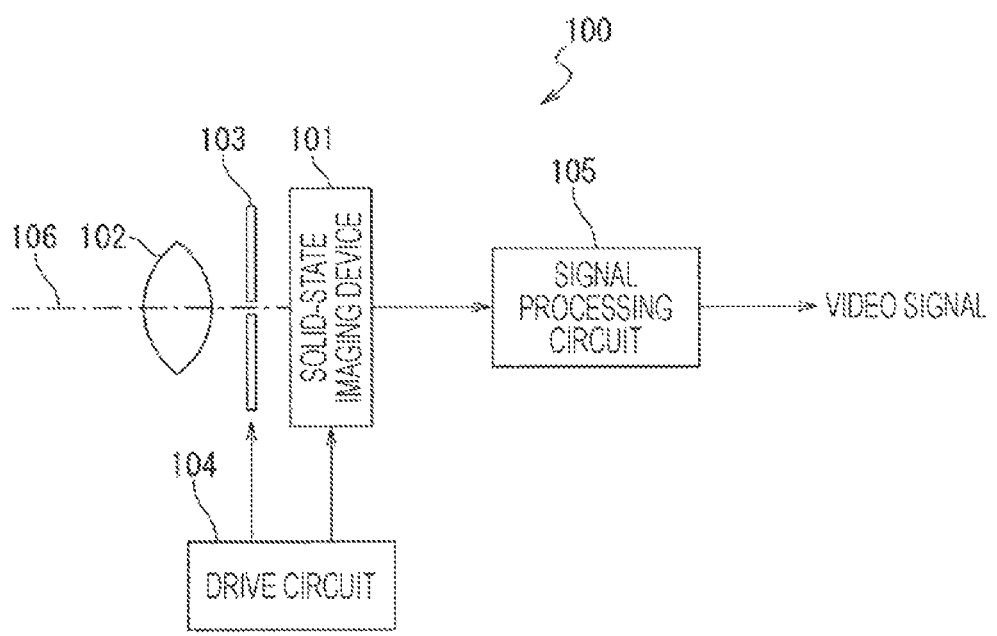
FIG. 13 is a schematic configuration diagram of an electronic device according to a second embodiment.

The solid-state imaging device 1 in FIG. 1 is a back-illuminated complementary metal oxide semiconductor (CMOS) image sensor. As illustrated in FIG. 13, the solid-state imaging device 1 (101) captures image light (incident light 106) from a subject via an optical lens 102, converts a light amount of the incident light 106 forming an image on an imaging surface into an electrical signal in units of pixels, and outputs the electrical signal as a pixel signal.

As illustrated in FIG. 1, the solid-state imaging device 1 includes a substrate 2, a pixel region 3, a vertical drive circuit 4, a column signal processing circuit 5, a horizontal drive circuit 6, an output circuit 7, and a control circuit 8.

The pixel region 3 has a plurality of pixels 9 regularly arranged in a two-dimensional array on the substrate 2. The pixel 9 includes a photoelectric conversion part 23 illustrated in FIG. 2 and a plurality of pixel transistors (not illustrated). As the plurality of pixel transistors, four transistors of a transfer transistor, a reset transistor, a selection transistor, and an amplifier transistor can be adopted, for example. Furthermore, for example, three transistors excluding the selection transistor may be adopted.

The vertical drive circuit 4 includes a shift register, for example, selects a desired pixel drive wiring 10, supplies a pulse for driving the pixels 9 to the selected pixel drive wiring 10, and drives the pixels 9 in row units. That is, the vertical drive circuit 4 selectively scans the pixels 9 of the pixel region 3 in the vertical direction sequentially in row units, and supplies the column signal processing circuit 5 with a pixel signal based on a signal charge generated according to the amount of received light in the photoelectric conversion part 23 of each pixel 9 through a vertical signal line 11.

The column signal processing circuit 5 is arranged for each column of the pixels 9, for example, and performs signal processing such as noise removal on signals output from the pixels 9 for one row for each pixel column. For example, the column signal processing circuit 5 performs signal processing such as correlated double sampling (CDS) for removing pixel-specific fixed pattern noise and analog digital (AD) conversion.

The horizontal drive circuit 6 includes a shift register, for example, sequentially selects the column signal processing circuits 5 by sequentially outputting horizontal scanning pulses to the column signal processing circuits 5, and causes each of the column signal processing circuits 5 to output a pixel signal subjected to signal processing to a horizontal signal line 12.

The output circuit 7 performs signal processing on pixel signals sequentially supplied from the column signal processing circuits 5 through the horizontal signal line 12, and outputs the processed pixel signals. As the signal processing, for example, buffering, black level adjustment, column variation correction, various digital signal processing, and the like can be used.

On the basis of a vertical synchronization signal, a horizontal synchronization signal, and a master clock signal, the control circuit 8 generates a clock signal and a control signal, which serve as a reference for operations of the vertical drive circuit 4, the column signal processing circuit 5, the horizontal drive circuit 6, and the like. Then, the control circuit 8 outputs the generated clock signal and control signal to the vertical drive circuit 4, the column signal processing circuit 5, the horizontal drive circuit 6, and the like.

[1-2 Configuration of Main Part]

Figure 2:
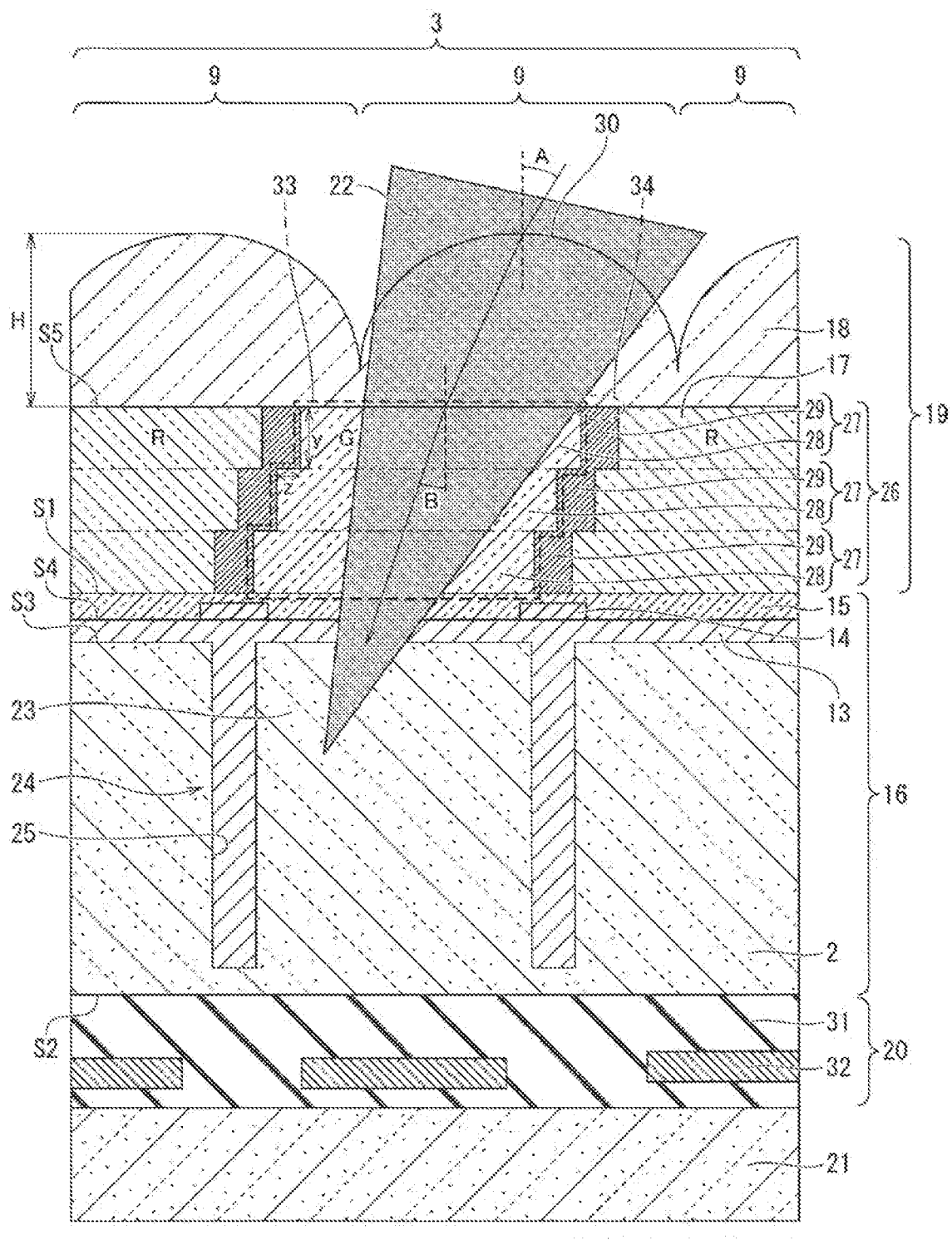
FIG. 2 is a diagram illustrating a cross-sectional configuration of the solid-state imaging device cut along line A-A in FIG. 1.

Next, a detailed structure of the solid-state imaging device 1 of FIG. 1 will be described. FIG. 2 is a diagram illustrating a cross-sectional configuration of the solid-state imaging device 1 in a case where the solid-state imaging device 1 is cut along line A-A in FIG. 1.

As illustrated in FIG. 2, the solid-state imaging device 1 includes a light receiving layer 16 formed by laminating the substrate 2, an insulating film 13, a light shielding film 14, and a flattening film 15 in this order. Furthermore, a condensing layer 19 in which a color filter layer 17 and a microlens array 18 are laminated in this order is formed on a surface (hereinafter also referred to as "back surface S1") of the light receiving layer 16 on the flattening film 15 side. Moreover, a wiring layer 20 and a support substrate 21 are laminated in this order on a surface (hereinafter also referred to as "front surface S2") of the light receiving layer 16 on the substrate 2 side. Note that since the back surface S1 of the light receiving layer 16 and the back surface of the flattening film 15 are the same surface, the back surface of the flattening film 15 is also referred to as a "back surface S1" in the following description. Furthermore, since the front surface S2 of the light receiving layer 16 and the front surface of the substrate 2 are the same surface, the surface of the substrate 2 is also referred to as "front surface S2" in the following description.

The substrate 2 includes, for example, a semiconductor substrate including silicon (Si), and forms the pixel region 3. In the pixel region 3, a plurality of pixels 9 including the photoelectric conversion part 23 is arranged in a two-dimensional array. Each of the photoelectric conversion parts 23 is embedded in the substrate 2 to form a photodiode, generates a signal charge corresponding to the light amount of incident light 22, and accumulates the generated signal charge.

Furthermore, each photoelectric conversion part 23 is physically separated by a pixel separation part 24. The pixel separation part 24 is formed in a lattice shape so as to surround each photoelectric conversion part 23. The pixel separation part 24 includes a bottomed trench part 25

(groove part) formed in the depth direction from a surface (hereinafter also referred to as "back surface S3") side of the substrate 2 facing the insulating film 13. The trench part 25 is formed in a lattice shape such that its inner side surface and bottom surface form the outer shape of the pixel separation part 24. Furthermore, the insulating film 13 covering the back surface S3 side of the substrate 2 is embedded inside the trench part 25.

The insulating film 13 continuously covers the entire back surface S3 side (the entire light receiving surface side) of the substrate 2 and the inside of the trench part 25. As the material of the insulating film 13, an insulator can be used, for example. Specifically, silicon oxide ($SiO_2$) and silicon nitride (SiN) can be adopted. Furthermore, the light shielding film 14 is formed in a lattice shape that opens the light receiving surface side of each of the plurality of photoelectric conversion parts 23 in a part of the insulating film 13 on the back surface S4 side so as not to allow light to leak into the adjacent pixels 9. Furthermore, the flattening film 15 continuously covers the entire back surface S5 side (entire light receiving surface side) of the insulating film 13 including the light shielding film 14 such that the back surface S1 of the light receiving layer 16 is a flat surface with no unevenness.

The color filter layer 17 includes a waveguide module 26 for each pixel 9 on the back surface S1 side (light receiving surface side) of the flattening film 15. The waveguide module 26 is formed by laminating a plurality of waveguides 27. FIG. 2 illustrates a case where there are three waveguides 27, and the height of all waveguide wall parts 29 and the height of all filter component members 28 are the same. Each of the waveguides 27 includes the filter component member 28 and the waveguide wall part 29 (separation part).

The filter component member 28 is an optical filter that transmits light of a specific wavelength included in the incident light 22 condensed by a microlens 30. As the light having a specific wavelength, red light, green light, and blue light can be adopted, for example. Furthermore, as each of the filter component members 28 included in the same waveguide module 26, a filter component member 28 that transmits light of the same color is used. As a result, a color filter 33 including the plurality of filter component members 28 included in the waveguide module 26 is formed. The light having the specific wavelength transmitted through the color filter 33 is incident on the photoelectric conversion part 23. Furthermore, for example, a Bayer array can be adopted as an array pattern of the filter component member 28 in a case of being viewed from the microlens 30 side. As the material of the filter component member 28, an organic glass material having a refractive index of 1.4 to 1.9 can be adopted, for example.

The waveguide wall part 29 is formed so as to surround the filter component members 28 included in the same waveguide 27. Furthermore, the waveguide wall part 29 is shared by the waveguides 27 of the same stage and adjacent to each other. That is, the waveguide wall part 29 of each stage is formed in a lattice shape so as to surround the filter component members 28 of the same stage. In other words, a plurality of waveguide wall parts 29 is arranged between the color filters 33 of all the filter component members 28. As the material of the waveguide wall part 29, a low refractive material having a refractive index lower than that of the filter component member 28 included in the same waveguide 27 can be adopted, for example. As the low refractive material, a low refractive index resin having a refractive index of 1.0 to 1.2 can be adopted, for example.

As a result, in the waveguide 27, the core is formed by the filter component member 28 having the relatively high refractive index, and the cladding is formed by the waveguide wall part 29 having the relatively low refractive index. Furthermore, FIG. 2 illustrates a case where the height, the width, and the material of the waveguide wall parts 29 of the stages are the same. That is, the waveguide wall parts 29 of the stages are members having the same shape and the same material. Note that the "width of the waveguide wall part 29" is a width of the waveguide wall part 29 in a direction parallel to the back surface S3 (light receiving surface) of the substrate 2 in a cross section perpendicular to the back surface S3 (light receiving surface) of the substrate 2. One example of the "width of the waveguide wall part 29" is, in a case where the waveguide wall part 29 is viewed from the microlens 30 side, the length of the waveguide wall part 29 in a direction intersecting (orthogonal to, or the like) a direction in which the waveguide wall part 29 extends.

Figure 3:
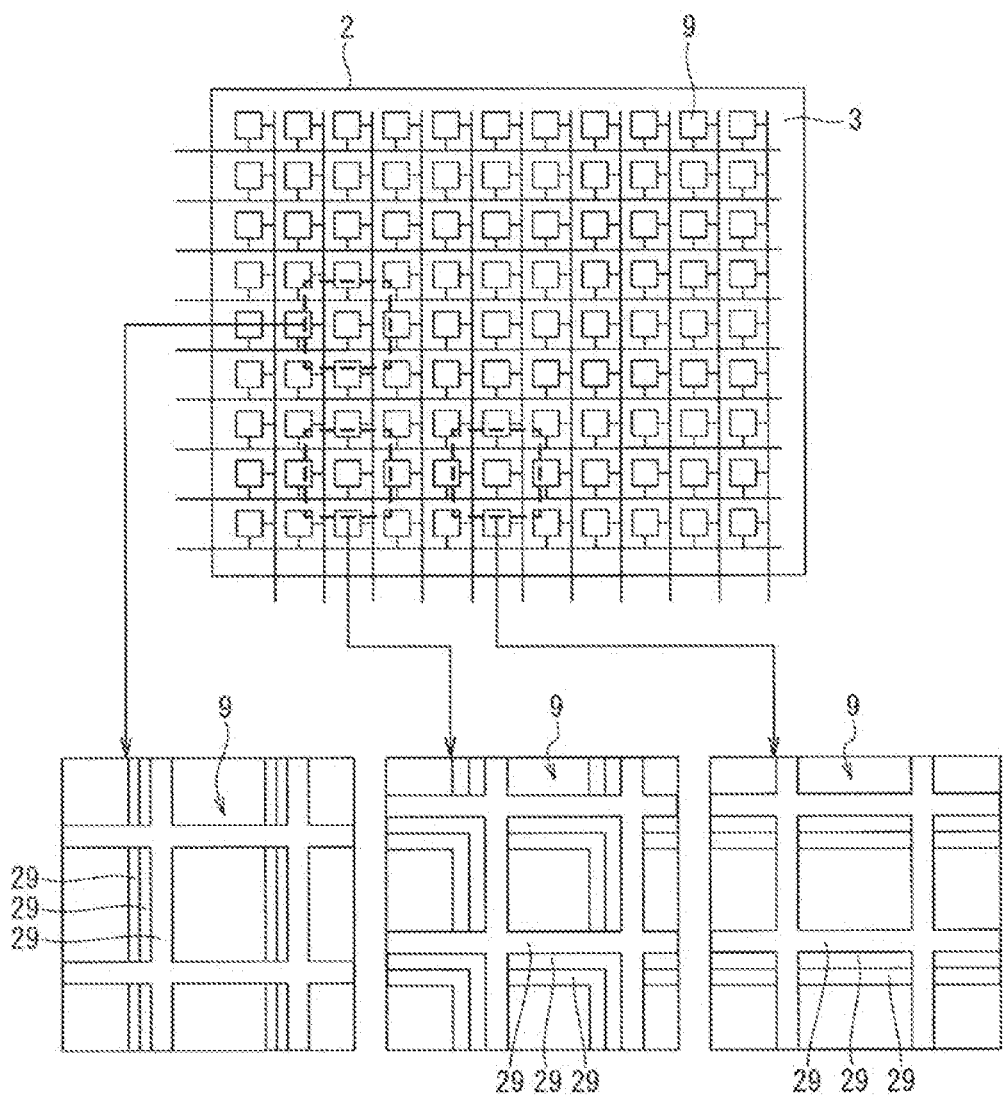
FIG. 3 is a diagram illustrating a deviation direction of a waveguide wall part of each stage.

Furthermore, each of the plurality of waveguide wall parts 29 is formed in a position where pupil correction is individually performed. That is, pupil correction is performed on each of the plurality of waveguides 27 included in each waveguide module 26 on the end side (high image height) of the pixel region 3. Specifically, as illustrated in FIGS. 2 and 3, among the waveguide wall parts 29 stacked on top of one another, the waveguide wall part 29 of a stage on the microlens array 18 side (microlens 30 side) is shifted toward the central part of the pixel region 3 than the waveguide wall part 29 of a stage on the photoelectric conversion part 23 side. In FIG. 2, the central axis of the lower waveguide wall part 29 coincides with the central axis of the pixel separation part 24, the central axis of the middle waveguide 27 is shifted toward the central part of the pixel region 3 from the central axis of the lower waveguide wall part 29, and the central axis of the upper waveguide wall part 29 is shifted toward the central part of the pixel region 3 from the central axis of the middle waveguide 27. Furthermore, in FIG. 3, when viewed from the microlens array 18 side, in the waveguide module 26 in the region on the left side of the central part of the pixel region 3 in FIG. 3, the middle and upper waveguide wall parts 29 are shifted to the right side in FIG. 3, in the waveguide module 26 in the region on the lower side of the central part of the pixel region 3 in FIG. 3, the middle and upper waveguide wall parts 29 are shifted to the upper side in FIG. 3, and in the waveguide module 26 in the region on the lower left side of the central part of the pixel region 3 in FIG. 3, the middle and upper waveguide wall parts 29 are shifted to the upper right side in FIG. 3. Note that in FIG. 3, the filter component member 28 is omitted to facilitate understanding of the state of deviation of the waveguide wall part 29. Furthermore, FIG. 3 illustrates a case where the amounts of deviation of the waveguide wall parts 29 are the same.

Figure 4:
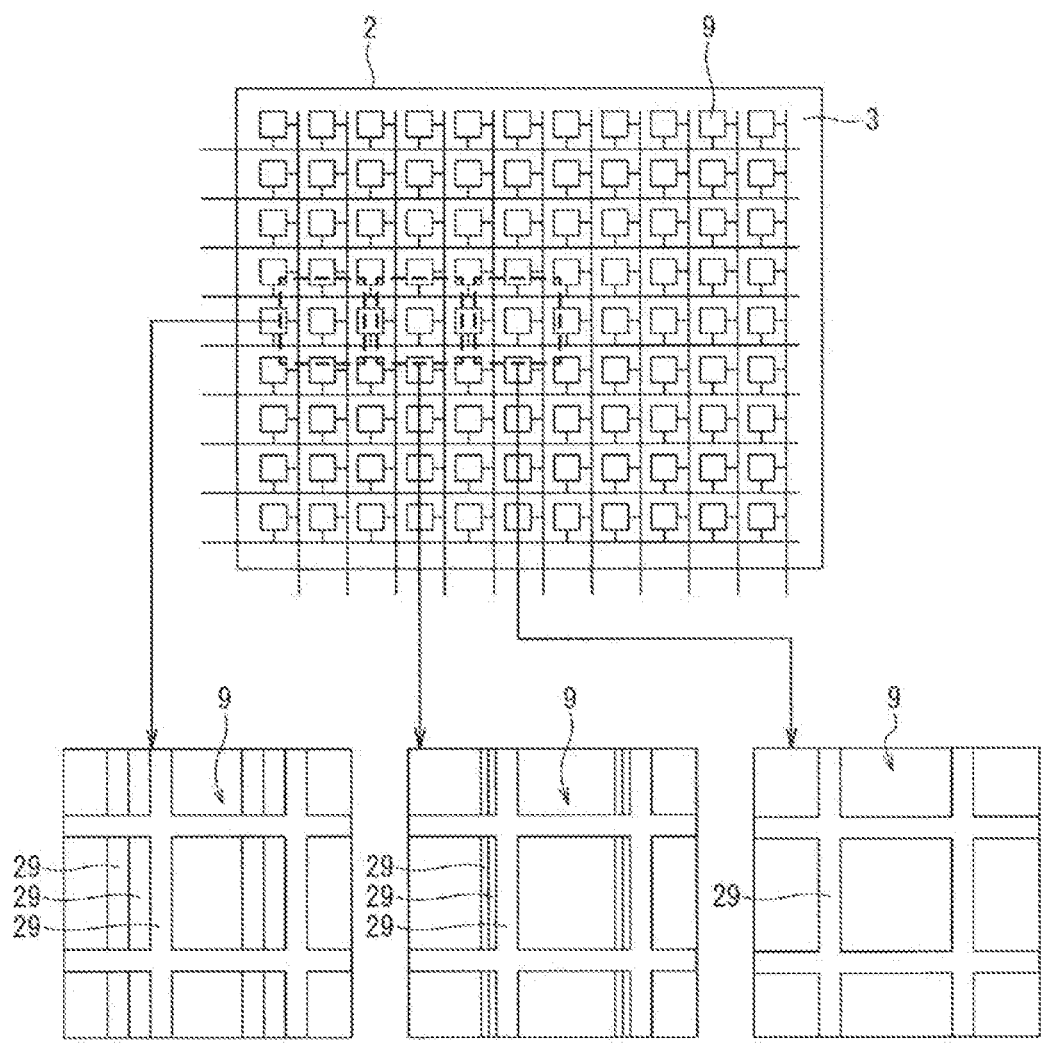
FIG. 4 is a diagram illustrating an amount of deviation of a waveguide wall part of each stage.

Furthermore, as illustrated in FIG. 4, the amount of deviation between the uppermost waveguide wall part 29 and the lowermost waveguide wall part 29 is increased as the distance from the central part of the pixel region 3 is longer when viewed from the microlens array 18 side. In FIG. 4, the amount of deviation (=0) between the waveguide wall parts 29 in the waveguide module 26 at the central part of the pixel region 3<the amount of deviation between the waveguide wall parts 29 in the waveguide module 26 in a region slightly away from the central part of the pixel region 3<the amount of deviation between the waveguide wall parts 29 in the waveguide module 26 in a region significantly away from the pixel region 3. Furthermore, in the waveguide wall parts 29 stacked on top of one another, the amount of deviation of the waveguide wall part 29 of the stage on the microlens array 18 side is within a range of ±x/2 of a width x of the waveguide wall part 29 of the stage on the photoelectric conversion part 23 side. That is, the amount of deviation is determined such that there is no gap between the waveguide wall parts 29 stacked on top of one another.

Furthermore, an optimum shift amount z of the waveguide wall part 29 can be calculated from, for example, Snell's law. Specifically, as illustrated in FIG. 2, the optimum shift amount z of the waveguide wall part 29 can be calculated according to the following Formula (1) on the basis of an incident angle A [deg] of the incident light 22, a refractive index n of the filter component member 28 (color filter 33), and a height y of the waveguide wall part 29 to be shifted.

$$z = y \times \tan B \quad (1)$$

$$\sin B = n / \sin A$$

Here, B [deg] is a refraction angle of the filter component member 28 (color filter 33).

Here, the incident light 22 is obliquely incident on the microlens on the end side (high image height) of the pixel region 3. In view of the above, in the waveguide module 26, since the waveguide wall part 29 is formed in a position subjected to pupil correction, the obliquely incident incident light 22 can be prevented from hitting the microlens array 18 side (part indicated by circle 34 in FIG. 2) of the waveguide wall part 29, and the incident light 22 can be prevented from being scattered by the waveguide wall part 29. Furthermore, in the microlens 30, the incident light 22 is partially diffracted by the diffraction action of the microlens 30, and the diffracted incident light 22 spreads. As a countermeasure, in the waveguide module 26, since the zigzag waveguide is formed so as to extend in a direction parallel to the obliquely incident incident light 22, light can be reflected at the interface between the filter component member 28 and the waveguide wall part 29, the spread incident light 22 is returned to the central side of the pixel 9, and entry of the incident light 22 into another pixel 9 can be curbed.

The microlens array 18 includes the microlens 30 for each pixel 9 on the back surface S5 side (light receiving surface side) of the color filter layer 17. Each of the microlenses 30 condenses image light (incident light 22) from a subject into the photoelectric conversion part 23 via the waveguide module 26.

Furthermore, pupil correction is performed on each of the microlenses 30 on the end side (high image height) of the pixel region 3. Specifically, as illustrated in FIG. 2, each of the microlenses 30 is shifted toward the central part of the pixel region 3 from the waveguide module 26. Furthermore, the microlens 30 is formed to have a reduced height. A height H of the microlens 30 is, for example, preferably 300 nm or less, and more preferably 200 nm or less. As the height H, a distance between the top and the bottom of the microlens 30 can be adopted, for example. By reducing the height of the microlens 30, even if the incident light 22 is partially diffracted by the diffraction action of the microlens 30, the entire diffracted incident light 22 can be guided into the waveguide module 26 before the diffracted incident light 22 spreads, and the incident light 22 can be prevented from entering the adjacent pixel 9.

The wiring layer 20 is formed on the front surface S2 side of the substrate 2, and includes an interlayer insulating film 31 and wiring 32 laminated in a plurality of layers with the interlayer insulating film 31 interposed therebetween. Then, the wiring layer 20 drives the pixel transistors included in each pixel 9 via the plurality of layers of wiring 32.

The support substrate 21 is formed on a surface of the wiring layer 20 on a side opposite to a side facing the substrate 2. The support substrate 21 is a substrate for securing the strength of the substrate 2 at the manufacturing stage of the solid-state imaging device 1. As the material of the support substrate 21, silicon (Si) can be used, for example.

In the solid-state imaging device 1 having the above configuration, light is emitted from the back surface side (back surface S1 side of light receiving layer 16) of the substrate 2, the emitted light passes through the microlens 30 and the waveguide module 26, and the transmitted light is photoelectrically converted by the photoelectric conversion part 23 to generate a signal charge. Then, the generated signal charge is output as a pixel signal by the vertical signal line 11 illustrated in FIG. 1 including the wiring 32, via the pixel transistors formed on the front surface S2 side of the substrate 2.

[1-3 Method of Forming Color Filter Layer]

Next, a method of forming the color filter layer 17 in the solid-state imaging device 1 will be described.

Figure 5A:
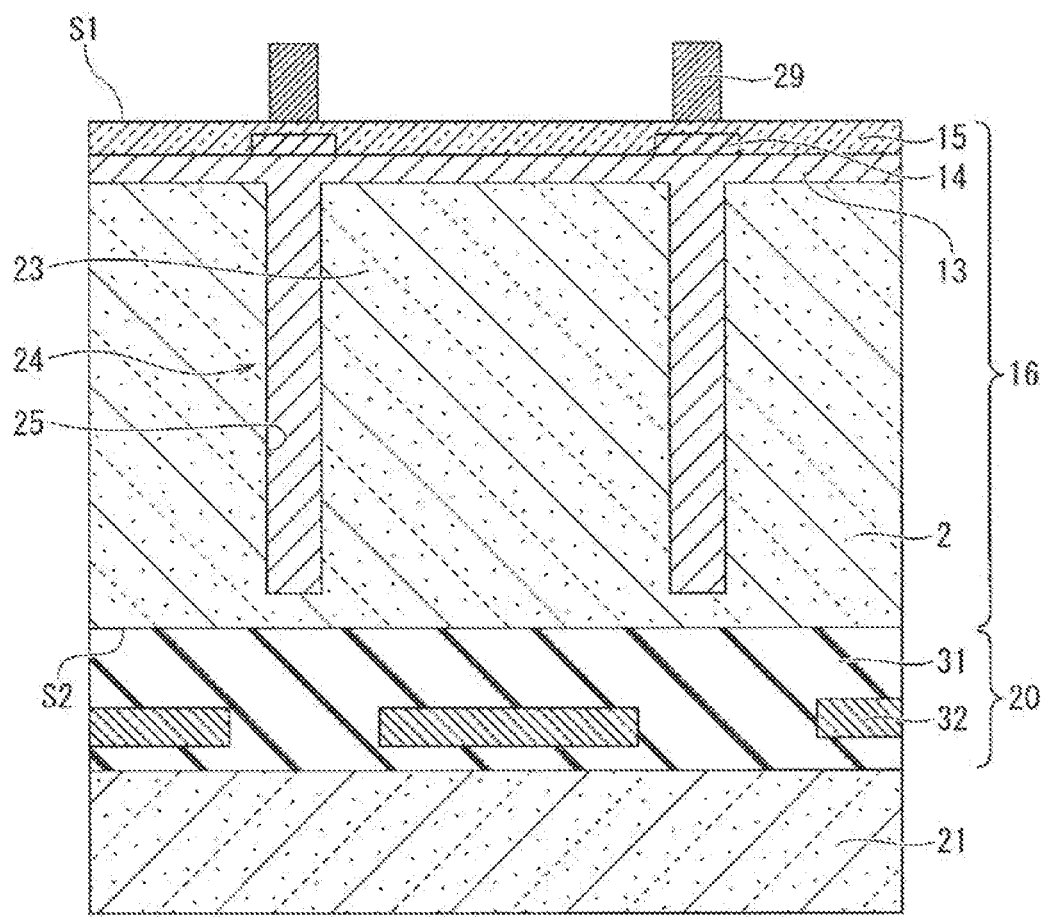
FIG. 5A is a diagram illustrating a flow of a manufacturing process of the solid-state imaging device.

First, as illustrated in FIG. 5A, the waveguide wall part 29 of the lower waveguide 27 among the lower, middle, and upper waveguides 27 illustrated in FIG. 3 is formed on the back surface S1 of the light receiving layer 16.

Figure 5B:
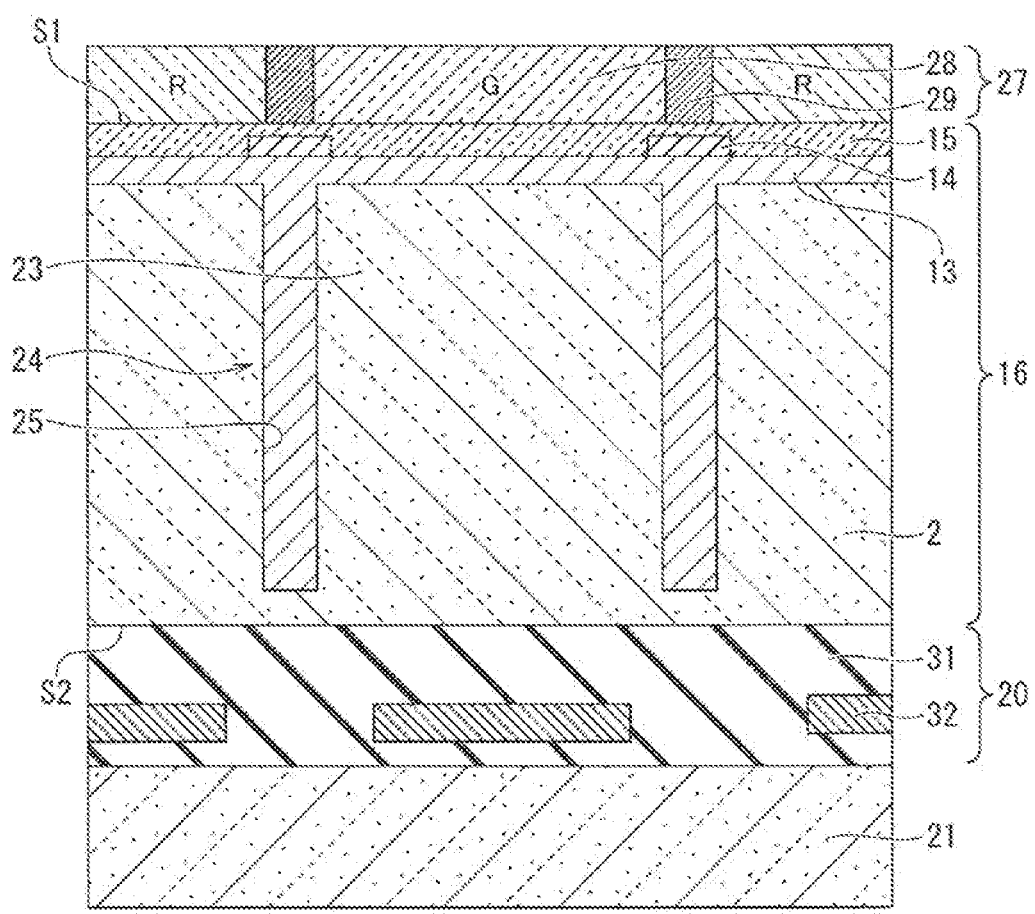
FIG. 5B is a diagram illustrating a flow of the manufacturing process of the solid-state imaging device.

Subsequently, as illustrated in FIG. 5B, the filter component member 28 is formed in each space surrounded by the formed waveguide wall part 29 to form the lower waveguide 27.

Figure 5C:
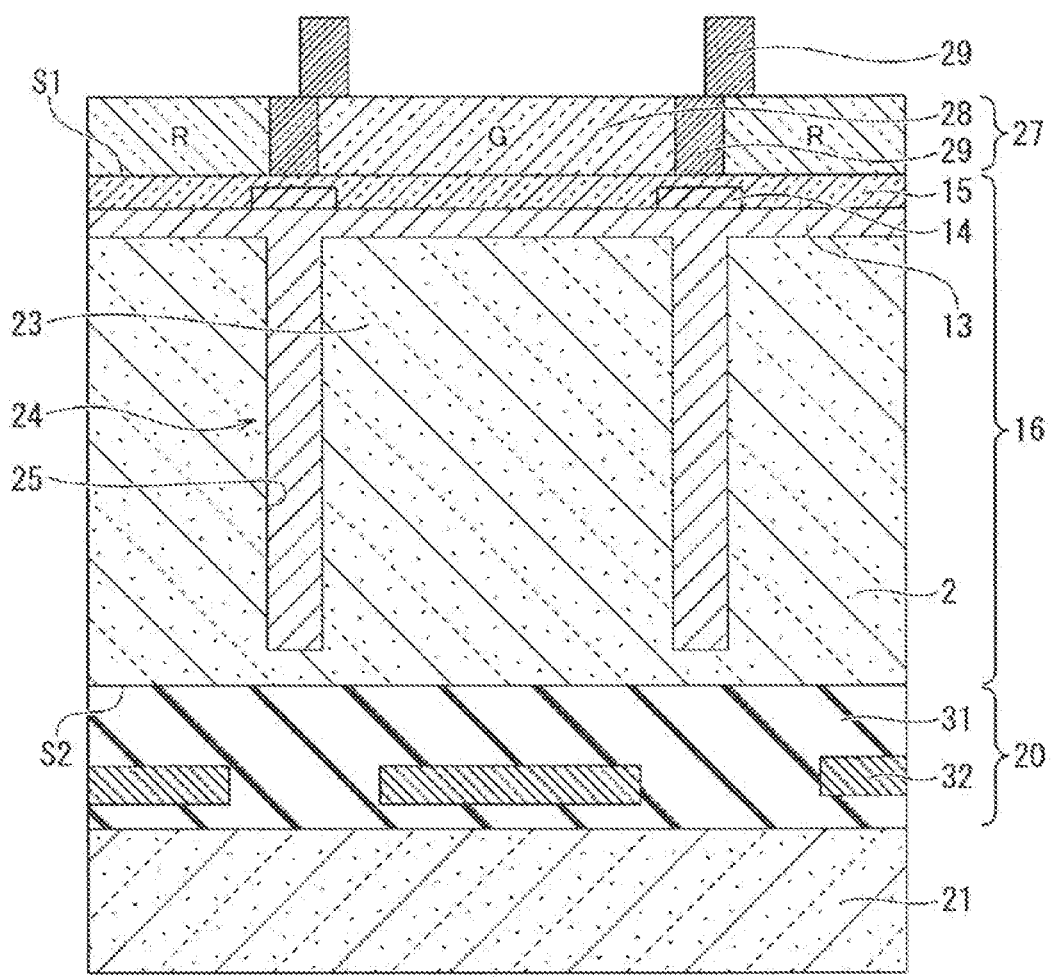
FIG. 5C is a diagram illustrating a flow of the manufacturing process of the solid-state imaging device.

Subsequently, as illustrated in FIG. 5C, the waveguide wall part 29 of the middle waveguide 27 is formed on the waveguide wall part 29 of the lower waveguide 27 so as to be shifted toward the central part of the pixel region 3 from the waveguide wall part 29 of the lower waveguide 27.

Figure 5D:
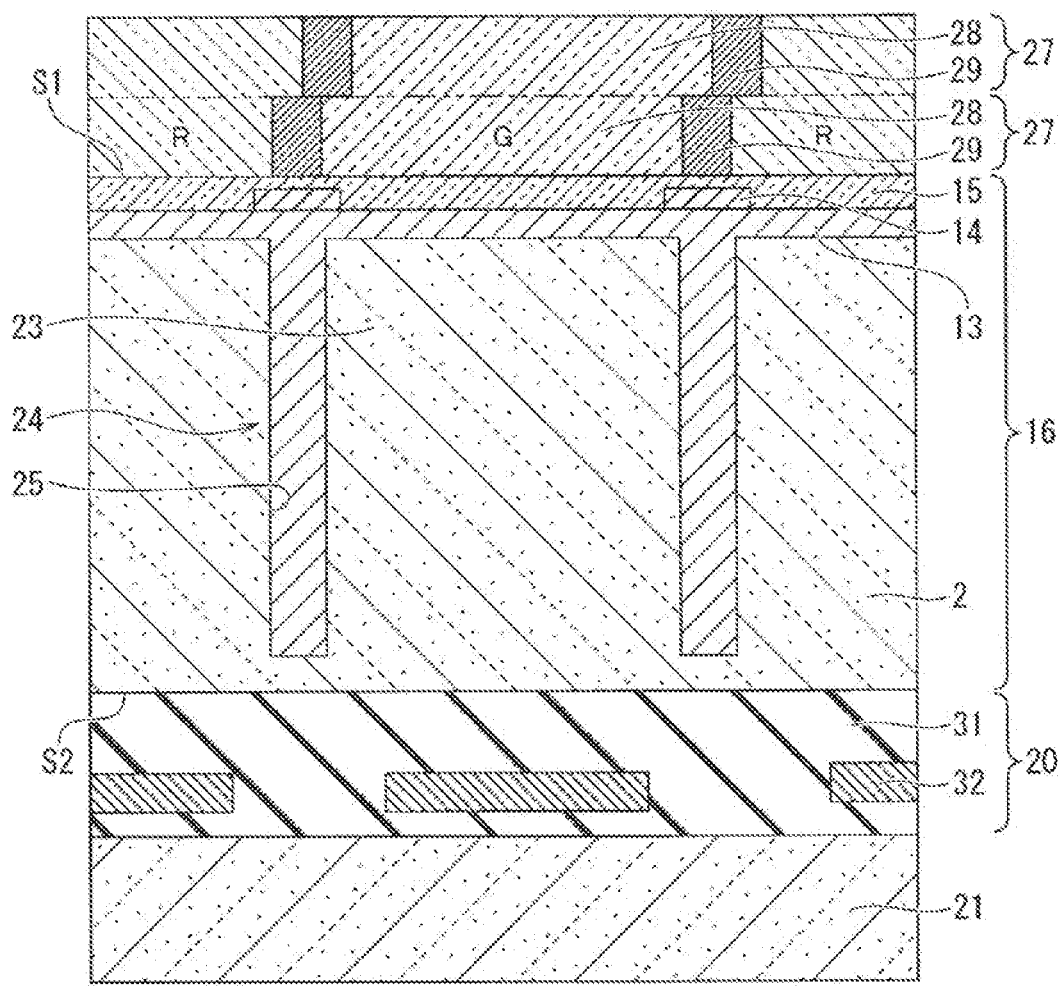
FIG. 5D is a diagram illustrating a flow of the manufacturing process of the solid-state imaging device.

Subsequently, as illustrated in FIG. 5D, the filter component member 28 is formed in each space surrounded by the formed waveguide wall part 29 to form the middle waveguide 27.

Figure 5E:
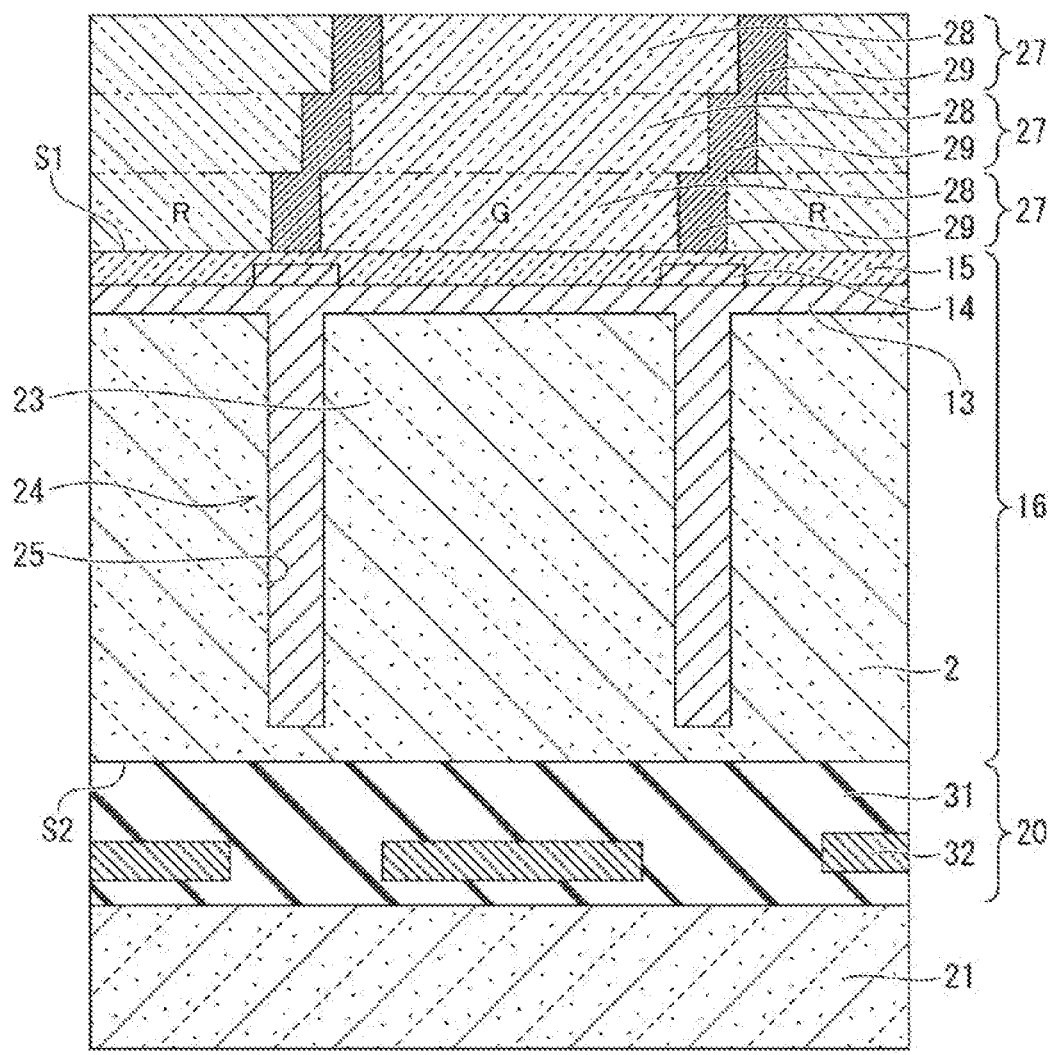
FIG. 5E is a diagram illustrating a flow of the manufacturing process of the solid-state imaging device.

Subsequently, as illustrated in FIG. 5E, the waveguide wall part 29 of the upper waveguide 27 is formed on the waveguide wall part 29 of the middle waveguide 27 so as to be shifted toward the central part of the pixel region 3 from the waveguide wall part 29 of the middle waveguide 27, and the filter component member 28 is formed in each space surrounded by the formed waveguide wall part 29 to form the upper waveguide 27. As a result, the color filter layer 17 including the plurality of waveguide modules 26 is obtained.

As described above, the solid-state imaging device 1 of the first embodiment includes the plurality of waveguide wall parts 29 surrounding the color filters 33 between the color filters 33. Then, each of the plurality of waveguide wall parts 29 is formed in a position subjected to pupil correction.

Therefore, it is possible to form a waveguide in which the color filter 33 is used as the core and the plurality of waveguide wall parts 29 is used as the cladding, to curb diffusion of the incident light 22 to other pixels 9 in the color filter 33, and to improve sensitivity of each pixel 9. Furthermore, while the incident light 22 is normally obliquely incident on the microlens on the end side of the pixel region 3, the obliquely incident incident light 22 can be prevented from hitting the microlens 30 side (part indicated by circle 34 in FIG. 2) of the waveguide wall part 29, the incident light 22 can be prevented from being reflected by the waveguide wall part 29, and sensitivity of each pixel 9 can be further improved. Furthermore, it is possible to prevent scattered light from entering other pixels 9 to cause color mixture. Therefore, it is possible to provide the solid-state imaging device 1 capable of enhancing sensitivity of the pixel 9 and preventing color mixture.

Furthermore, the solid-state imaging device 1 of the first embodiment has a back-illuminated structure, that is, with the back surface S1 of the substrate 2 opposite to the front surface S2 of the substrate 2 on which the wiring layer 20 is formed as a light receiving surface, a structure in which the incident light 22 is incident from the back surface S1 side of the substrate 2. Therefore, the incident light 22 is incident on the photoelectric conversion part 23 without being restricted by the wiring layer 20. Therefore, the opening of the photoelectric conversion part 23 can be made wide, and, for example, higher sensitivity can be achieved than that of a front-illuminated structure.

[1-4 Modification]

Figure 6:
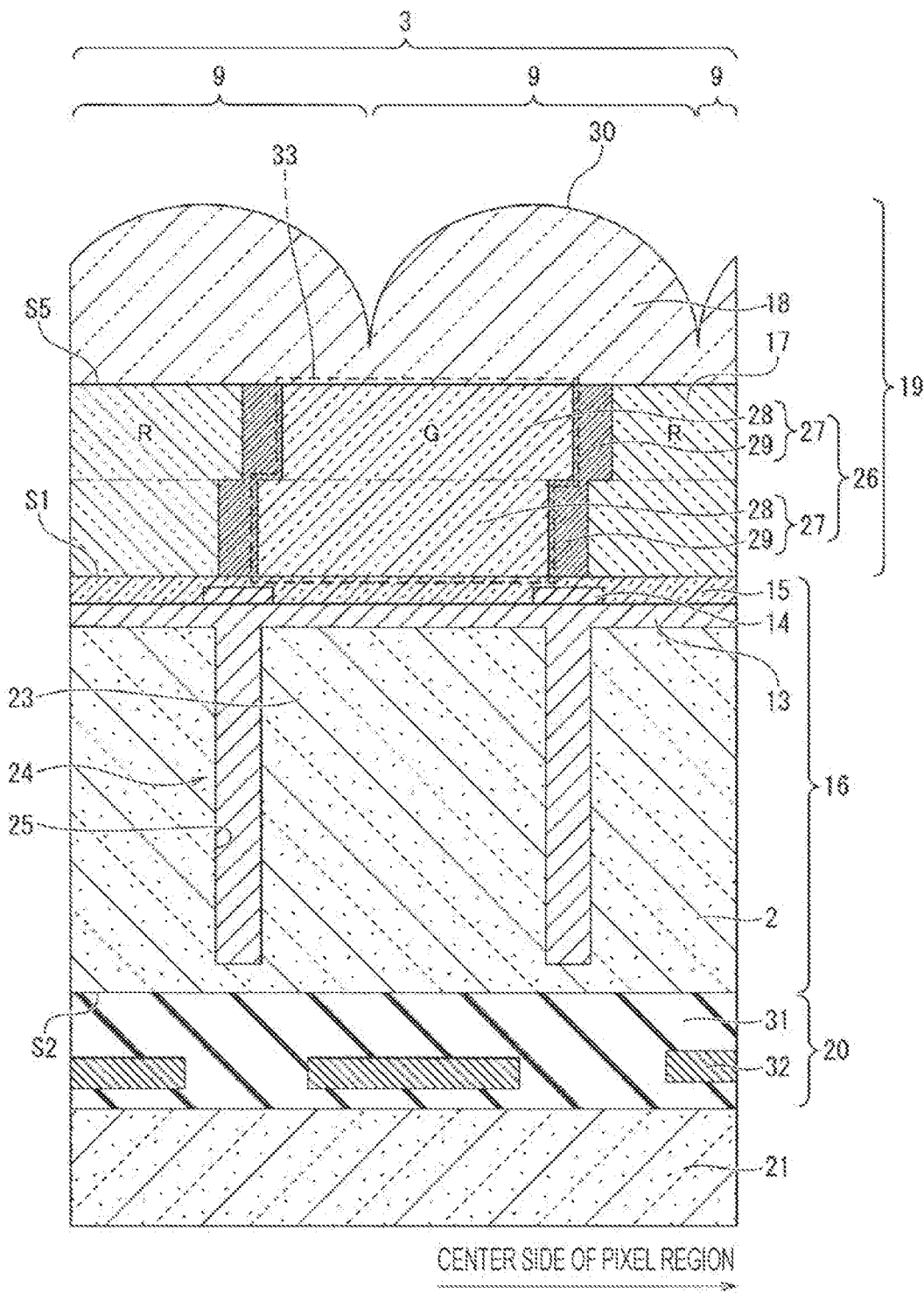
FIG. 6 is a diagram illustrating a cross-sectional configuration of a solid-state imaging device according to a modification.
Figure 7:
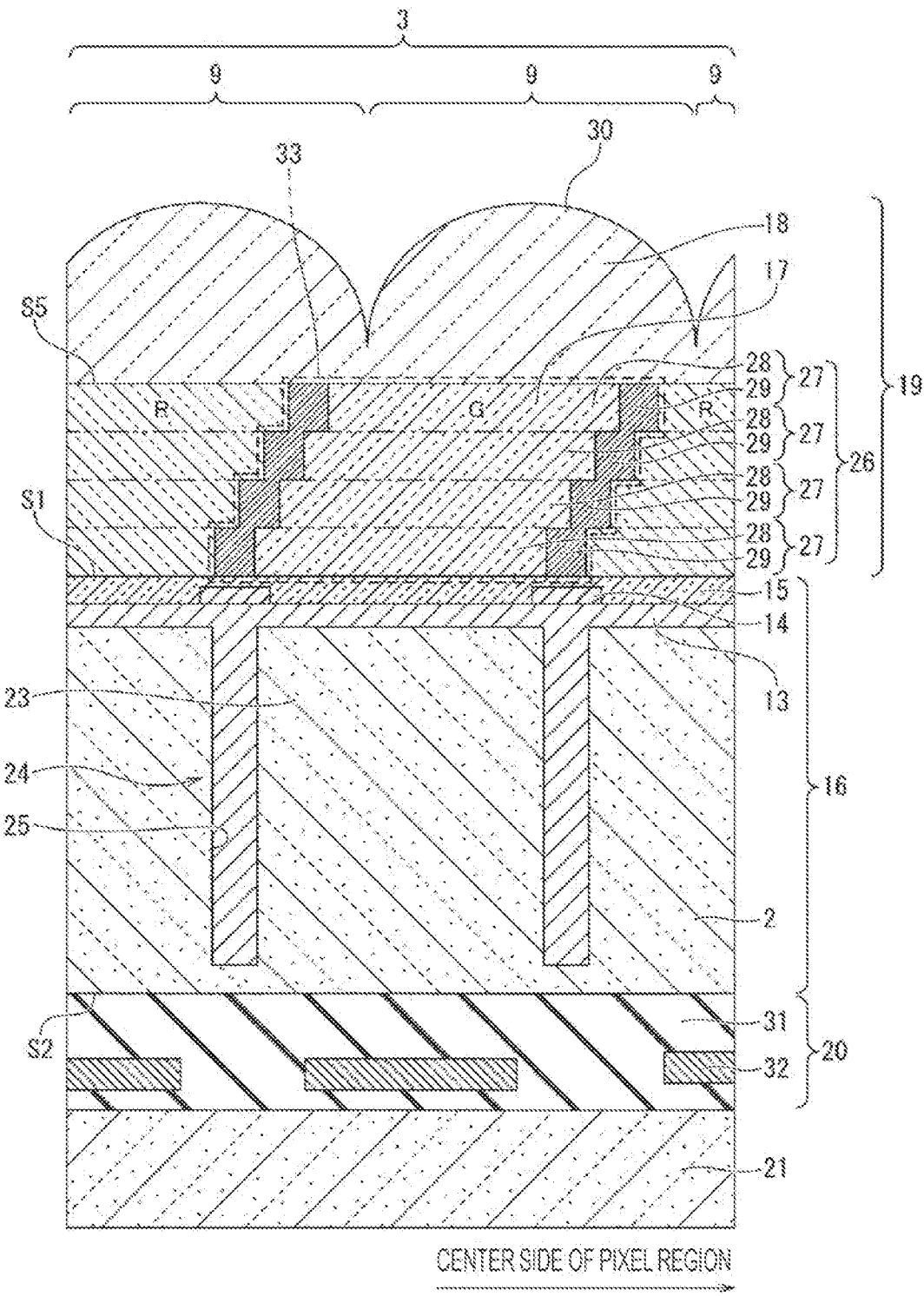
FIG. 7 is a diagram illustrating a cross-sectional configuration of a solid-state imaging device according to a modification.

(1) Note that while the first embodiment describes an example in which there are three waveguide wall parts 29, other configurations can be adopted. For example, as illustrated in FIGS. 6 and 7, the number of stages may be less than three or more than three. FIG. 6 illustrates a case where there are two waveguide wall parts 29. Furthermore, FIG. 7 illustrates a case where there are four waveguide wall parts 29. By increasing the number of the waveguide wall parts 29 to more than three, the waveguide formed by the entire waveguide module 26 can be tilted more steeply, which is suitable for a mobile device in which a high CRA (chie ray angle) is required.

(2) Furthermore, while the first embodiment describes an example in which the amount of deviation between the uppermost waveguide wall part 29 and the lowermost waveguide wall part 29 is increased as the distance from the central part of the pixel region 3 is longer, other configurations can be adopted. For example, a configuration may be adopted in which, when viewed from the microlens array 18 side, pupil correction is not performed on the waveguide wall part 29 in a region where the distance from the central part of the pixel region 3 is equal to or less than a predetermined distance, and pupil correction is performed only on the waveguide wall part 29 in a region where the distance from the central part of the pixel region 3 is larger than the predetermined distance. In this case, as the pupil correction, the amount of deviation between the uppermost waveguide wall part 29 and the lowermost waveguide wall part 29 may be constant regardless of the distance from the central part of the pixel region 3.

Figure 8:
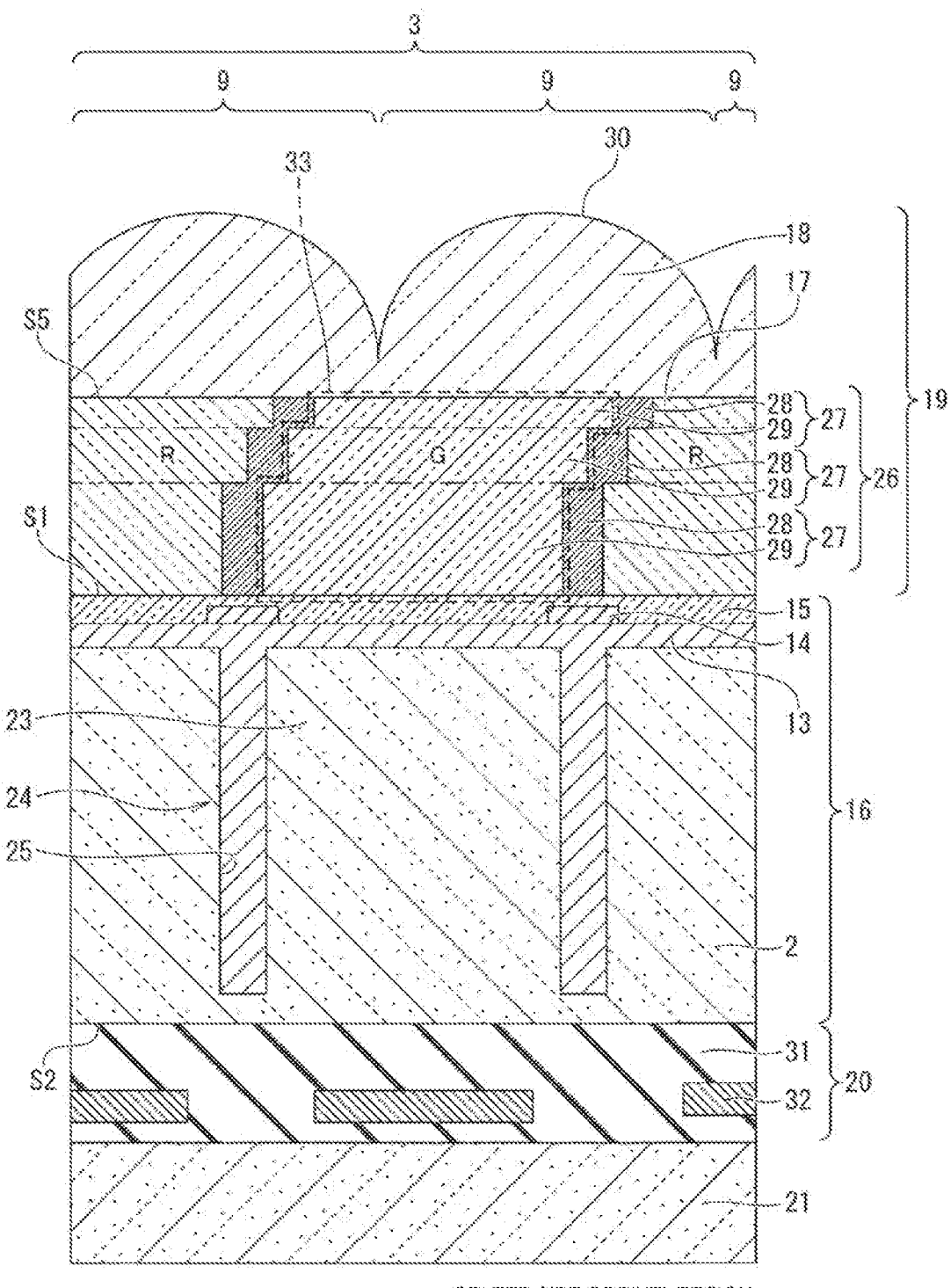
FIG. 8 is a diagram illustrating a cross-sectional configuration of a solid-state imaging device according to a modification.

(3) Furthermore, while the first embodiment describes an example in which the height of each waveguide wall part 29 is the same, other configurations can be adopted. For example, the height of the waveguide wall part 29 may be different between two or more waveguide wall parts 29 among the plurality of waveguide wall parts 29. Specifically, as illustrated in FIG. 8, all of the waveguide wall parts 29 may have a different height, and the height of the waveguide wall part 29 on the microlens 30 side may be made lower than the height of the waveguide wall part 29 on the photoelectric conversion part 23 side.

Here, for example, when the waveguide module 26 is formed, in a case where the waveguide wall part 29 and the filter component member 28 have the same height in the first waveguide 27, the second waveguide wall part 29 is supported by both the first waveguide wall part 29 and the first filter component member 28. However, for example, in a case where the waveguide wall part 29 is higher than the filter component member 28 in the first waveguide 27, the second waveguide wall part 29 is not supported by the first filter component member 28 and is supported only by the first waveguide 27, and thus may collapse. As a countermeasure, when the height of the waveguide wall part 29 on the microlens 30 side is made lower than the height of the waveguide wall part 29 on the photoelectric conversion part 23 side, the waveguide wall part 29 is less likely to collapse, so that the waveguide wall part 29 can be formed relatively easily. Furthermore, for example, as compared with a configuration in which all the waveguide wall parts 29 are formed low, the number of the waveguide wall parts 29 can be reduced, and the manufacturing cost can be reduced.

Figure 9:
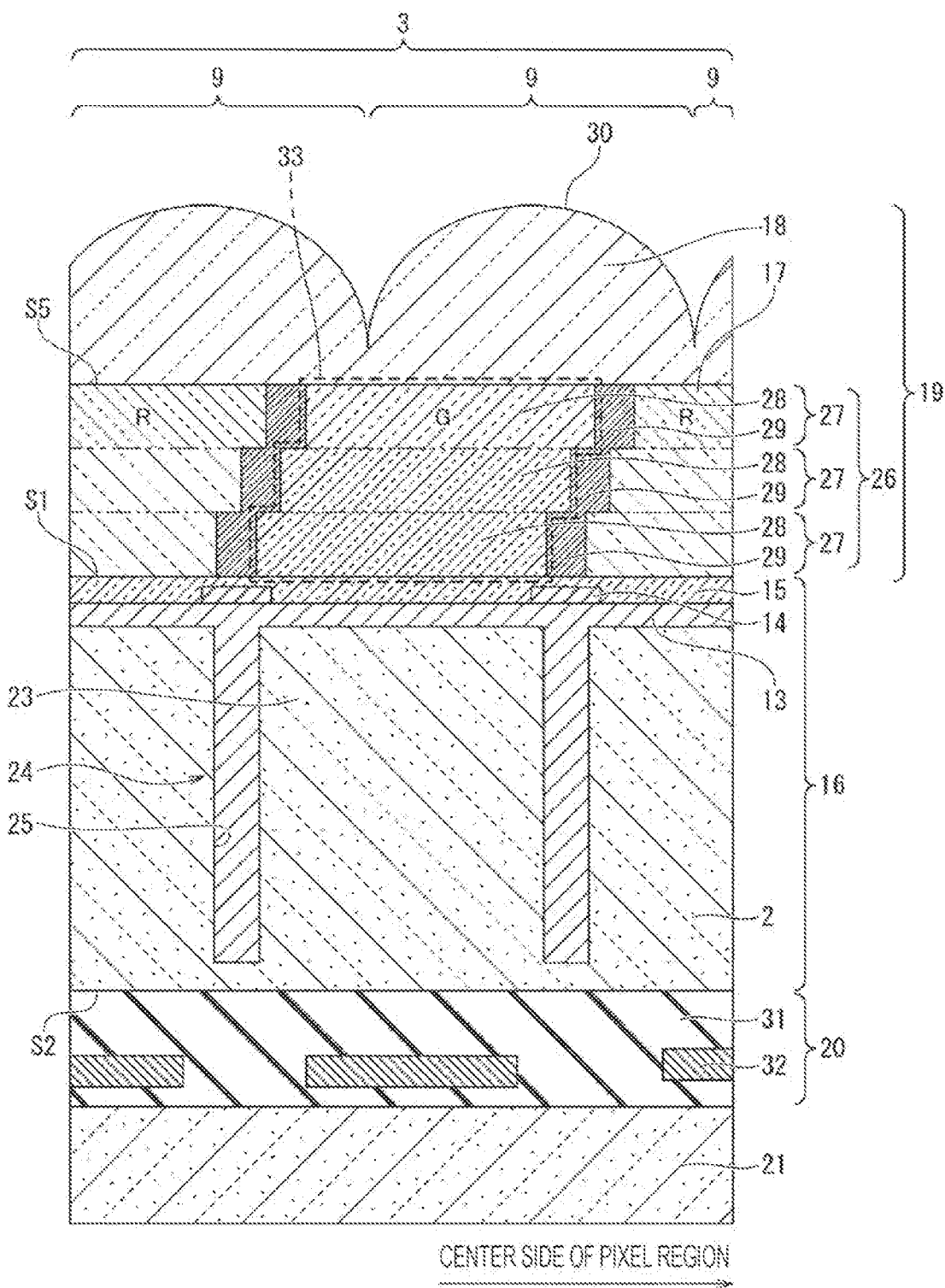
FIG. 9 is a diagram illustrating a cross-sectional configuration of a solid-state imaging device according to a modification.

(4) Furthermore, while the first embodiment describes an example in which the materials of the plurality of filter component members 28 are the same, other configurations can be adopted. For example, the material of the filter component member 28 may be different between two or more filter component members 28 among the plurality of filter component members 28. Specifically, as illustrated in FIG. 9, the viscosity of the materials of the filter component members 28 other than the filter component member 28 closest to the microlens 30 may be made lower than the viscosity of the material of the filter component member 28 closest to the microlens 30. In FIG. 9, the viscosity of the materials of the first and second filter component members 28 is made lower than the viscosity of the material of the third filter component member 28. As the material of the filter component member 28, a resist resin for a color filter can be adopted, for example.

Here, for example, when the waveguide module 26 is formed, in a case where there is unevenness on the surface of the filter component member 28 in the first waveguide 27, the second waveguide wall part 29 may collapse because a part of the second waveguide wall part 29 is provided on the unevenness of the first filter component member 28. Therefore, in a case where there is unevenness, the surface of the filter component member 28 needs to be polished and flattened after formation of the filter component member 28. As a countermeasure, by making the viscosity of the material of the color filter 33 in stages other than the stage closest to the microlens 30 lower than the viscosity of the material of the color filter 33 in the stage closest to the microlens 30, it is possible to reduce the unevenness of the surfaces of the first and second filter component members 28, and eliminate the polishing process of the surface of the filter component member 28.

Figure 10:
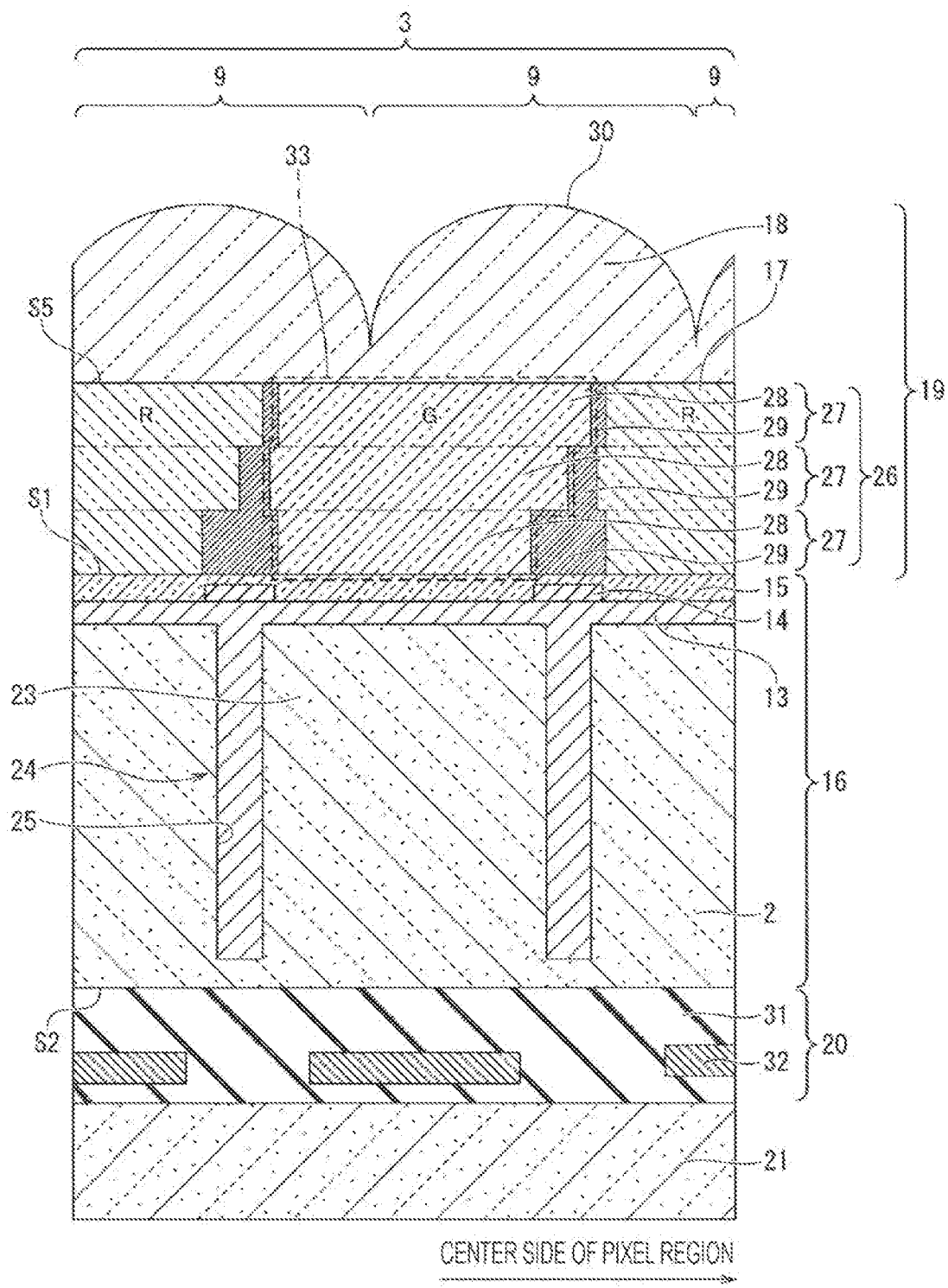
FIG. 10 is a diagram illustrating a cross-sectional configuration of a solid-state imaging device according to a modification.

(5) Furthermore, while the first embodiment describes an example in which the width of each waveguide wall part 29 is the same, other configurations can be adopted. For example, the width of the waveguide wall part 29 may be different between two or more waveguide wall parts 29 among the plurality of waveguide wall parts 29. Specifically, as illustrated in FIG. 10, all of the waveguide wall parts 29 may have a different width, and the width of the waveguide wall part 29 on the photoelectric conversion part 23 side may be made larger than the width of the waveguide wall part 29 on the microlens 30 side.

Here, for example, when the waveguide module 26 is formed, in a case where the waveguide wall part 29 and the filter component member 28 have the same height in the first waveguide 27, the second waveguide wall part 29 is supported by both the first waveguide wall part 29 and the first filter component member 28. However, for example, in a case where the waveguide wall part 29 is higher than the filter component member 28 in the first waveguide 27, the second waveguide wall part 29 is not supported by the first filter component member 28 and is supported only by the first waveguide 27, and thus may collapse. As a countermeasure, by making the width of the waveguide wall part 29 on the photoelectric conversion part 23 side wider than the width of the waveguide wall part 29 on the microlens 30 side, the contact area between the waveguide wall parts 29 can be increased, and the waveguide wall part 29 is less likely to collapse, so that the waveguide wall part 29 can be formed relatively easily.

Figure 11:
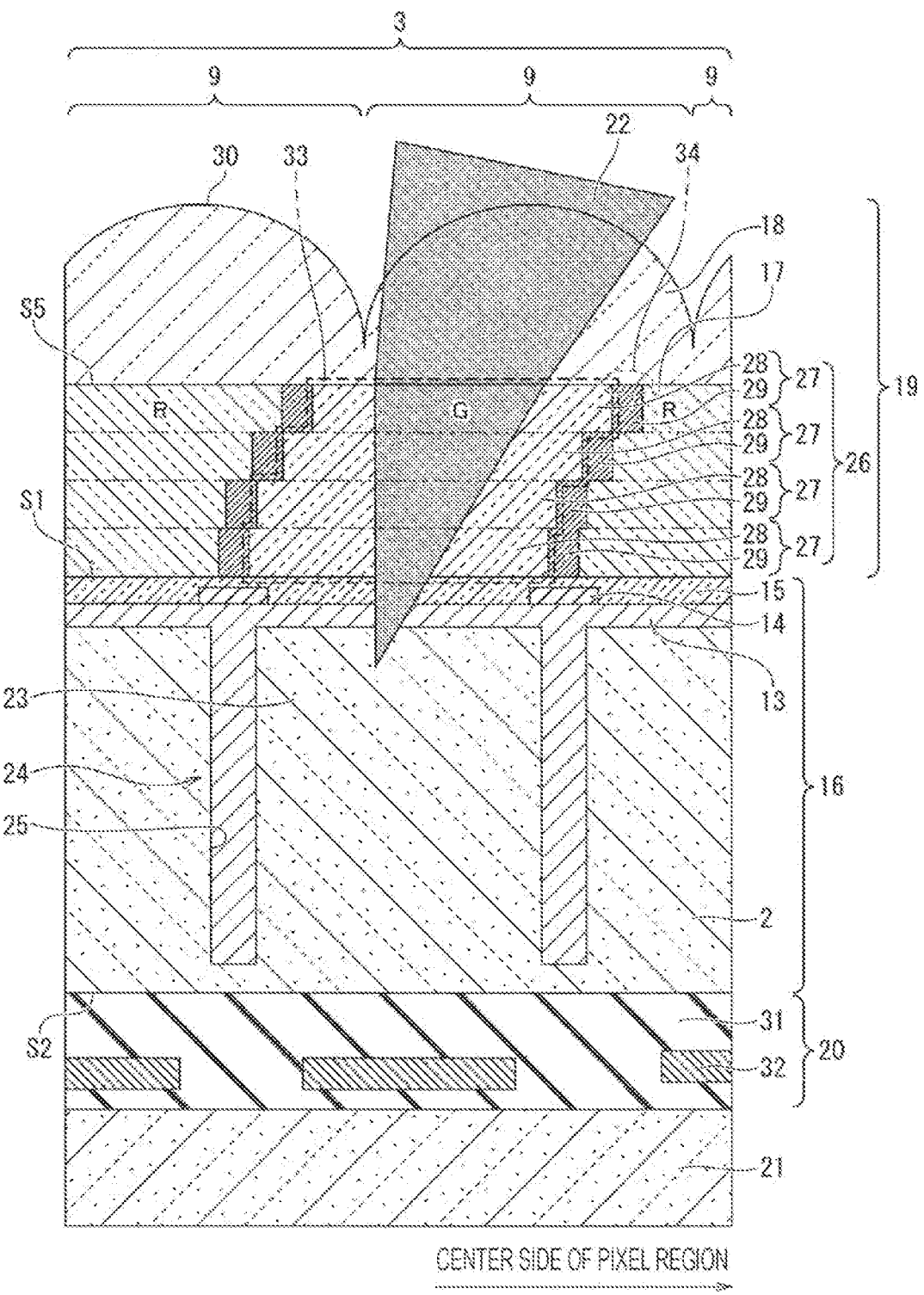
FIG. 11 is a diagram illustrating a cross-sectional configuration of a solid-state imaging device according to a modification.

(6) Furthermore, while the first embodiment describes an example in which the amount of deviation of each waveguide wall part 29 is the same, other configurations can be adopted. For example, the amount of deviation of the waveguide wall part 29 may be different between two or more waveguide wall parts 29 among the plurality of waveguide wall parts 29. Specifically, as illustrated in FIG. 11, all of the waveguide wall parts 29 may have different amounts of deviation, and the amounts of deviation of the waveguide wall parts 29 on the microlens 30 side may be made larger than the amounts of deviation of the waveguide wall parts 29 on the photoelectric conversion part 23 side. In FIG. 11, the magnitude relationship of the amount of deviation is as follows: the amount of deviation between the third waveguide wall part 29 and the fourth waveguide wall part 29>the amount of deviation between the second waveguide wall part 29 and the third waveguide wall part 29>the amount of deviation between the first waveguide wall part 29 and the second waveguide wall part 29.

Here, since the incident light 22 condensed by the microlens 30 is refracted at the interface between the microlens 30 and the filter component member 28, the refraction angle becomes smaller than the incidence angle. As illustrated in FIG. 11, as the ratio ($n_2/n_1$) between a refractive index $n_1$ of the microlens 30 and a refractive index $n_2$ of the filter component member 28 increases, the refractive angle of the incident light 22 is drastically reduced. In view of the above, by making the amount of deviation of the waveguide wall part 29 on the microlens 30 side larger than the amount of deviation of the waveguide wall part 29 on the photoelectric conversion part 23 side, it is possible to prevent the obliquely incident incident light 22 from hitting the microlens 30 side (part indicated by circle 34 in FIG. 11) of the waveguide wall part 29 and to cause the light condensed by the microlens 30 to travel to the photoelectric conversion part 23 without hitting the waveguide wall parts 29. As a result, sensitivity of each pixel 9 can be further improved.

Furthermore, in a case of adopting such a configuration, by combining the configuration in which the height of the waveguide wall part 29 on the microlens 30 side is lower than the height of the waveguide wall part 29 on the photoelectric conversion part 23 side in the plurality of waveguide wall parts 29 as illustrated in FIG. 8, the amount of deviation of the waveguide wall part 29 on the microlens 30 side is increased easily, and the waveguide wall part 29 can be formed relatively easily.

Figure 12:
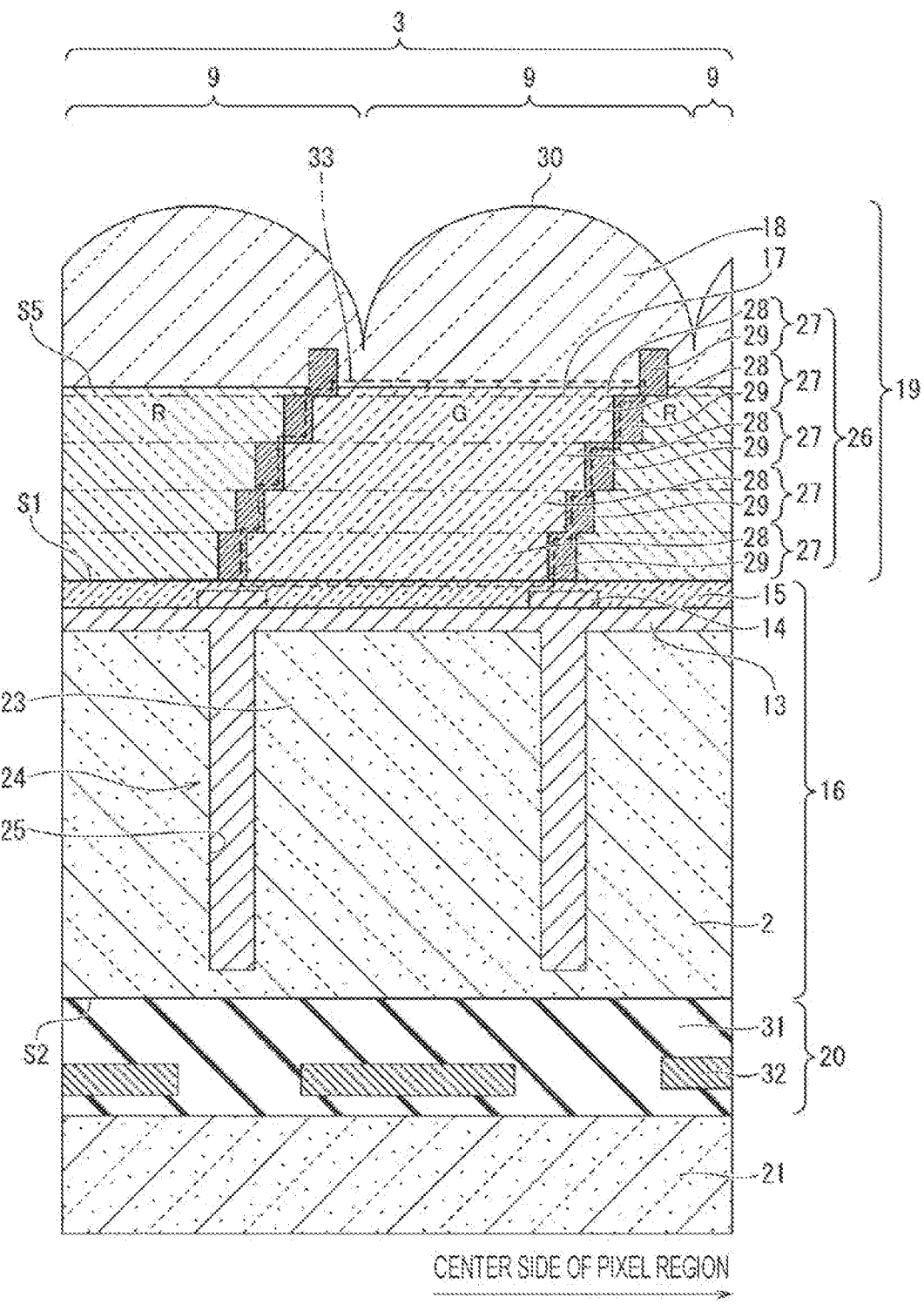
FIG. 12 is a diagram illustrating a cross-sectional configuration of a solid-state imaging device according to a modification.

(7) Furthermore, while the first embodiment describes an example in which the overall height of the plurality of waveguide wall parts 29 is the same as the height of the color filter 33, other configurations can be adopted. For example, the entire height of the plurality of waveguide wall parts 29 may be different from the height of the color filter 33. Specifically, as illustrated in FIG. 12, the overall height of the plurality of waveguide wall parts 29 may be made higher than the height of the color filter 33. In FIG. 12, the upper end side of the fifth waveguide wall part 29 protrudes from the color filter 33 and is located between the microlenses 30.

Here, for example, in a case where the overall height of the plurality of waveguide wall parts 29 is made lower than the height of the color filter 33, the uppermost waveguide wall part 29 is less likely to collapse, so that the waveguide wall part 29 can be relatively easily formed and the process difficulty level can be lowered. However, since the distance between the microlens 30 and the waveguide wall part 29 becomes long, the entire incident light 22 diffracted and spread by the microlens 30 cannot be guided into the waveguide module 26, and the waveguide effect may be weakened. Furthermore, since a part of the incident light 22 passes through the color filter 33 of the adjacent pixel 9, the incident light 22 may be weakened, and sensitivity of each pixel 9 may be lowered. On the other hand, by making the overall height of the plurality of waveguide wall parts 29 higher than the height of the color filter 33, the entire diffracted incident light 22 can be guided into the waveguide module 26 before the diffracted incident light 22 spreads, and the waveguide effect can be enhanced. Furthermore, since the incident light 22 does not pass through the color filter 33 of the adjacent pixel 9, sensitivity of each pixel 9 can be improved.

2. Second Embodiment: Example of Application to Electronic Device

The technology according to the present disclosure (present technology) may be applied to various electronic devices such as an imaging device like a digital still camera or a digital video camera, a mobile phone having an imaging function, or another device having an imaging function.

FIG. 13 is a diagram illustrating one example of a schematic configuration of an electronic device (e.g., camera) to which the technology according to the present disclosure (present technology) can be applied.

As illustrated in FIG. 13, an electronic device 100 includes a solid-state imaging device 101, the optical lens 102, a shutter device 103, a drive circuit 104, and a signal processing circuit 105.

The optical lens 102 forms an image of image light (incident light 106) from a subject on an imaging surface of the solid-state imaging device 101. As a result, signal charges are accumulated in the solid-state imaging device 101 over a certain period. The shutter device 103 controls a light irradiation period and a light shielding period for the solid-state imaging device 101. The drive circuit 104 supplies a drive signal for controlling a transfer operation of the solid-state imaging device 101 and a shutter operation of the shutter device 103. A signal of the solid-state imaging device 101 is transferred by a drive signal (timing signal) supplied from the drive circuit 104. The signal processing circuit 105 performs various types of signal processing on a signal (pixel signal) output from the solid-state imaging device 101. A video signal subjected to the signal processing is stored in a storage medium such as a memory or output to a monitor.

Note that the electronic device 100 to which the solid-state imaging device 1 can be applied is not limited to a camera, and the solid-state imaging device 1 can also be applied to other electronic devices. For example, the solid-state imaging device 1 may be applied to an imaging device such as a camera module for a mobile device like a mobile phone or a tablet terminal.

Hereinabove, one example of the electronic device to which the technology according to the present disclosure can be applied has been described. Among the configurations described above, the technology according to the present disclosure is applicable to the solid-state imaging device 101. Specifically, the solid-state imaging device 1 in FIG. 1 can be applied to the solid-state imaging device 101. By applying the technology according to the present disclosure to the solid-state imaging device 101, it is possible to capture an image with improved quality.

Note that the present technology can also be configured in the following manner.

(1)

A solid-state imaging device including:
a plurality of microlenses that condenses incident light;
a plurality of color filters that transmits light of a specific wavelength included in the condensed incident light;
a plurality of photoelectric conversion parts on which light having a specific wavelength transmitted through the color filter is incident; and
a plurality of waveguide wall parts arranged between the color filters and surrounding the color filter,
in which each of the plurality of waveguide wall parts is formed in a position subjected to pupil correction.

(2)

The solid-state imaging device according to (1) above,
in which the waveguide wall part includes a low refractive material having a refractive index lower than a refractive index of the color filter.

(3)

The solid-state imaging device according to (1) or (2) above,
in which a height of the waveguide wall part is different between two or more of the waveguide wall parts among the plurality of waveguide wall parts.

(4)

The solid-state imaging device according to (3) above,
in which a height of the waveguide wall part on the microlens side is lower than a height of the waveguide wall part on the photoelectric conversion part side.

(5)

The solid-state imaging device according to any one of (1) to (4) above,
in which the color filter includes a plurality of filter component members, and
a material of the filter component member is different between two or more of the filter component members among the plurality of filter component members.

(6)

The solid-state imaging device according to (5) above,
in which viscosity of a material of the color filter other than the color filter closest to the microlens is lower than viscosity of a material of the color filter closest to the microlens.

(7)

The solid-state imaging device according to any one of (1) to (6) above,
in which a width of the waveguide wall part is different between two or more of the waveguide wall parts among the plurality of waveguide wall parts.

In other words, (7) can also be described as "the solid-state imaging device according to any one of (1) to (6) above, in which
a width of the waveguide wall part in a direction parallel to the back surface S3 (light receiving surface) of the substrate 2 in a cross section perpendicular to the back surface S3 (light receiving surface) of the substrate 2 is different between two or more of the waveguide wall parts among the plurality of waveguide wall parts.".

(8)

The solid-state imaging device according to (7) above,
in which a width of the waveguide wall part on the photoelectric conversion part side is wider than a width of the waveguide wall part on the microlens side.

(9)

The solid-state imaging device according to any one of (1) to (8) above,
in which an amount of deviation of the waveguide wall part is different between two or more of the waveguide wall parts among the plurality of waveguide wall parts.

(10)

The solid-state imaging device according to (9) above,
in which an amount of deviation of the waveguide wall part on the microlens side is larger than an amount of deviation of the waveguide wall part on the photoelectric conversion part side.

(11)

The solid-state imaging device according to any one of (1) to (10) above,
in which an overall height of the plurality of waveguide wall parts is different from a height of the color filter.

(12)

The solid-state imaging device according to (11) above,
in which an overall height of the plurality of waveguide wall parts is higher than a height of the color filter.

(13)

The solid-state imaging device according to any one of (1) to (12) above,
in which the photoelectric conversion part has a back-illuminated structure.

(14)

The solid-state imaging device according to any one of (1) to (13) above,
in which a height of the microlens is 300 nm or less.

(15)

An electronic device including:
a solid-state imaging device that includes a plurality of microlenses that condenses incident light, a plurality of color filters that transmits light of a specific wavelength included in the condensed incident light, a plurality of photoelectric conversion parts on which light having a specific wavelength transmitted through the color filter is incident, and a plurality of waveguide wall parts arranged between the color filters and surrounding the color filter, each of the plurality of waveguide wall parts formed in a position subjected to pupil correction;
an optical lens that forms an image of image light from a subject on an imaging surface of the solid-state imaging device; and
a signal processing circuit that performs signal processing on a signal output from the solid-state imaging device.

REFERENCE SIGNS LIST

1 Solid-state imaging device
2 Substrate
3 Pixel region
4 Vertical drive circuit
5 Column signal processing circuit
6 Horizontal drive circuit
7 Output circuit
8 Control circuit
9 Pixel
10 Pixel drive wiring
11 Vertical signal line
12 Horizontal signal line
13 Insulating film
14 Light shielding film 15 Flattening film
16 Light receiving layer
17 Color filter layer
18 Microlens array
19 Condensing layer
20 Wiring layer
21 Support substrate
22 Incident light
23 Photoelectric conversion part
24 Pixel separation part
25 Trench part
26 Waveguide module
27 Waveguide
28 Filter component member
29 Waveguide wall part
30 Microlens
31 Interlayer insulating film
32 Wiring
33 Color filter
34 Circle
100 Electronic device
101 Solid-state imaging device
102 Optical lens
103 Shutter device
104 Drive circuit
105 Signal processing circuit
106 Incident light

What is claimed is:

1. A solid-state imaging device comprising:
a plurality of microlenses that condenses incident light;
a plurality of color filters that transmits light of a specific wavelength included in the condensed incident light;
a plurality of photoelectric conversion parts on which light having a specific wavelength transmitted through at least one the color filters is incident; and
a plurality of waveguide wall parts arranged between the color filters and surrounding the color filters,
wherein each of the plurality of waveguide wall parts is formed in a position subjected to pupil correction.

2. The solid-state imaging device according to claim 1, wherein each of the plurality of waveguide wall parts include a low refractive material having a refractive index lower than a refractive index of the color filters.

3. The solid-state imaging device according to claim 1, wherein a height of the waveguide wall parts is different between two or more of the waveguide wall parts among the plurality of waveguide wall parts.

4. The solid-state imaging device according to claim 3, wherein a height of the waveguide wall parts on a microlens side is lower than a height of the waveguide wall part on a photoelectric conversion part side.

5. The solid-state imaging device according to claim 1, wherein each of the color filters include a plurality of filter component members, and a material of the filter component members is different between two or more of the filter component members among the plurality of filter component members.

6. The solid-state imaging device according to claim 5, wherein a viscosity of a material of a filter component member other than a filter component member closest to a microlens is lower than viscosity of a material of the filter component member closest to the microlens.

7. The solid-state imaging device according to claim 1, wherein a width of the waveguide wall parts is different between two or more of the waveguide wall parts among the plurality of waveguide wall parts.

8. The solid-state imaging device according to claim 7, wherein a width of the waveguide wall parts on a photoelectric conversion part side is wider than a width of the waveguide wall parts on a microlens side.

9. The solid-state imaging device according to claim 1, wherein an amount of deviation of the waveguide wall parts is different between two or more of the waveguide wall parts among the plurality of waveguide wall parts.

10. The solid-state imaging device according to claim 9, wherein an amount of deviation of the waveguide wall parts on a microlens side is larger than an amount of deviation of the waveguide wall parts on a photoelectric conversion part side.

11. The solid-state imaging device according to claim 1, wherein an overall height of the plurality of waveguide wall parts is different from a height of the color filters.

12. The solid-state imaging device according to claim 11, wherein an overall height of the plurality of waveguide wall parts is higher than a height of the color filters.

13. The solid-state imaging device according to claim 1, wherein the photoelectric conversion part has a back-illuminated structure.

14. The solid-state imaging device according to claim 1, wherein a height of each microlens in the plurality of microlenses is 300 nm or less.

15. An electronic device comprising:
a solid-state imaging device that includes a plurality of microlenses that condenses incident light, a plurality of color filters that transmits light of a specific wavelength included in the condensed incident light, a plurality of photoelectric conversion parts on which light having a specific wavelength transmitted through at least one of the color filters is incident, and a plurality of waveguide wall parts arranged between the color filters and surrounding the color filters, each of the plurality of waveguide wall parts formed in a position subjected to pupil correction;
an optical lens that forms an image of image light from a subject on an imaging surface of the solid-state imaging device; and
a signal processing circuit that performs signal processing on a signal output from the solid-state imaging device.

* * * * *